(12) United States Patent
Barthod et al.

(10) Patent No.: US 7,095,038 B2
(45) Date of Patent: Aug. 22, 2006

(54) EUV SOURCE

(75) Inventors: Benoit Barthod, Naves-Parmelan (FR); Jean-Luc Rival, Villaz (FR); Matthieu Morpain, Pouilley les Vignes (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 10/946,109

(22) Filed: Sep. 22, 2004

(65) Prior Publication Data
US 2005/0072942 A1   Apr. 7, 2005

(30) Foreign Application Priority Data
Sep. 26, 2003   (FR) .................................. 03 11280

(51) Int. Cl.
*H01J 49/00*   (2006.01)
(52) U.S. Cl. .............. 250/504 R; 250/493.1; 378/119; 378/143; 378/124
(58) Field of Classification Search ............... None
See application file for complete search history.

(56) References Cited

U.S. PATENT DOCUMENTS

| | | | |
|---|---|---|---|
| 5,991,360 A * | 11/1999 | Matsui et al. | 378/119 |
| 6,304,630 B1 | 10/2001 | Bisschops et al. | |
| 6,788,763 B1 * | 9/2004 | Neff et al. | 378/119 |
| 6,882,704 B1 * | 4/2005 | Schriever et al. | 378/119 |

FOREIGN PATENT DOCUMENTS

| | | |
|---|---|---|
| EP | 0 858 249 A | 8/1998 |
| EP | 1 047 288 A | 10/2000 |

\* cited by examiner

*Primary Examiner*—Nikita Wells
*Assistant Examiner*—Zia R. Hashmi
(74) *Attorney, Agent, or Firm*—Sughrue Mion, PLLC

(57) ABSTRACT

The EUV radiation source of the invention comprises an irradiation chamber (1) containing an irradiation zone (3) into which a stream of radiation-generator material is generated such as a flow of xenon propagating along a direction (II—II) extending transversely relative to an optical axis (I—I). The irradiation zone (3) is in the proximity of a diaphragm (4) oriented on the optical axis (I—I) and putting the irradiation chamber (1) into communication with a transmission chamber (2). Power laser beams (5, 6) strike the stream of radiation-generator material in the irradiation zone (3) and produce EUV radiation which propagates through the diaphragm (4) and which is conditioned in the transmission chamber (2) by elliptical mirrors (13). Differential pumps (11, 12) maintain a pressure P2 in the transmission chamber (2) that is well below the pressure P1 in the irradiation chamber (1). The low pressure in the transmission chamber (2) ensures that the EUV radiation is transmitted with little attenuation to a zone of use, without requiring voluminous high speed pumps (11, 12).

20 Claims, 5 Drawing Sheets

EUV SOURCE

The present invention relates to the photo-litho-graphic techniques used for making semi-conductor components, and more particularly it relates to the means for producing extreme ultra-violet (EUV) radiation as used for producing micro-electronic semi-conductor components of geometry smaller than or equal to 70 nanometers (nm).

When manufacturing micro-electronic components, e.g. dynamic memory chips, semi-conductor wafers are processed in process chambers containing a gaseous atmosphere at low pressure.

Some of the steps of such processes consist in using a photo-litho-graphic technique in which light radiation is used to process or harden a surface layer of photo-sensitive material covering the semi-conductor wafer, which layer subsequently prevents certain zones of the semi-conductor being chemically etched.

It is desired to make integrated circuits having ever increasing component densities, and it is therefore necessary to make masks with portions in relief or other differing zones of ever smaller sizes. In this way, individual components such as transistors and diodes can be made of ever smaller size, thus enabling them to be integrated in ever increasing numbers on a given area of semi-conductor wafer. Unfortunately, the sizes of individual components and details that can be made using photo-litho-graphy on a semi-conductor wafer depends on the wave-length of the radiation used. It is therefore necessary to emit radiation of ever shorter wave-length.

The present trend is to use radiation having a wave-length of about 13.5 nm, which is known as EUV radiation. The EUV radiation band extends in general from 5 nm to 20 nm.

Furthermore, the time required for photo-litho-graphic processing, in order to process or harden a photo-sensitive layer, is directly proportional to the intensity of the radiation received by the layer during the photo-litho-graphic process. In order to reduce treatment times, and thus increase the rates at which micro-electronic components are produced, it is advantageous to have a source of radiation that is as intense as possible, and also to transmit the radiation as efficiently as possible between the source and the layer that is to be processed.

For this purpose, proposals have already been made in document U.S. Pat. No. 6,133,577 A to make a high power EUV radiation source comprising means for injecting a stream of radiation-generator material, i.e. a noble gas such as argon, helium, or xenon, at supersonic speed into the inlet of an irradiation zone. Diffuser means enable the stream of radiation-generator material to be collected at the outlet from the irradiation zone. Means enabling one or more energy beams to be generated and focused on the radiation-generator material in the irradiation zone thus serve to produce EUV radiation which is emitted by the radiation-generator material in the irradiation zone. This EUV radiation is collected and focused by optical means. All of the elements, such as the means for injecting the stream of radiation-generator gas, the means for collecting the stream of radiation-generator gas, and the means for collecting and focusing the emitted EUV radiation are contained in a single chamber which is maintained at a pressure of about 1.3 millibars (130 Pascals).

It can be seen that such a device is not applicable to photo-litho-graphic processes for producing micro-electronic components since the EUV radiation received by the layers to be processed is quite insufficient.

Document U.S. Pat. No. 6,576,912 B discloses apparatus for photo-litho-graphy by EUV radiation in which the radiation source can be a laser plasma source, a discharge plasma source, or a synchrotron radiation source. That document teaches that those radiation sources may require a pressure of about 0.1 millibars.

Thus, that document gives an example of a discharge plasma using xenon which emits radiation in particular in the range around 13.5 nm. The plasma is generated in an enclosure where the typical pressure is 0.1 millibars. At such a pressure, EUV radiation is rapidly absorbed: only 0.3% of the radiation remains after traveling along a path that is 1 meter (m) long.

In order to avoid the radiation being absorbed by the surrounding gas, that document recommends limiting the path of the radiation in the high pressure zone, by confining the light emission zone in a first vacuum chamber which is separated from a second vacuum chamber by a wall provided with a radiation transmission device which is transparent to the EUV radiation while opposing the passage of gas, the second chamber being maintained at a pressure that is 100 times lower by means of a turbo-molecular pump having an effective pumping speed of 6000 liters per second (L/s).

The device for transmitting radiation through the intermediate wall is constituted by a structure having a multiplicity of adjacent narrow channels separated by walls that are substantially parallel to the propagation direction of the radiation. The channels are of a diameter lying in the range 0.2 millimeters (mm) to 0.7 mm and they have a length of 5 mm to 50 mm.

A first difficulty lies in the fact at the EUV radiation sources mentioned in that document deliver EUV power that is not sufficient for the present requirements of the semi-conductor industry.

A second difficulty lies in the relative complexity of the radiation transmission device having adjacent narrow channels, and in the fact that the channels of small size present non-negligible risks of becoming progressively clogged over time.

Furthermore, that document advises against making use, in the intermediate wall between the two chambers at different pressures, either of an opening of the type that is transparent to EUV radiation, since such an opening would not prevent gas passing towards the downstream transmission chamber, or of a thin window, since that would run the risk of being damaged by the high temperature present in the irradiation zone.

The problem posed by the present invention is to devise a novel EUV radiation source, and photo-litho-graphy apparatus using such a radiation source, making it possible significantly to increase the intensity of the EUV radiation reaching the layers that are to be processed in photo-litho-graphic processes, so that said energy is sufficient for industrial application in the manufacture of micro-electronic components.

The invention also seeks to avoid using radiation transmission devices with multiple channels since such devices present the above-mentioned drawbacks and also prevent incident laser radiation from passing in the event of such radiation coming from the downstream transmission chamber.

The invention also seeks to solve these problems while using vacuum pumps having reasonable pumping speeds, making it possible to use pumps of small size that are compatible with the space that is acceptable for semi-conductor photo-litho-graphy apparatuses.

In order to achieve these objects and others, the invention provides a source of radiation in the extreme ultra-violet, the source comprising means for injecting a stream of radiation-generator material into the inlet of an irradiation zone, means for picking up the stream of radiation-generator material leaving the irradiation zone, means for generating and focusing power laser radiation on the radiation-generator material in the irradiation zone, and means for collecting and conditioning the EUV radiation emitted by the radiation-generator material in the irradiation zone. According to the invention:

the irradiation zone is situated in an irradiation chamber connected to first vacuum generator means for maintaining a first pressure;

the means for collecting and conditioning the emitted EUV radiation are placed in a transmission chamber which is connected to second vacuum generator means for maintaining a second pressure lower than the first pressure;

the transmission chamber communicates with the irradiation chamber via a diaphragm of small size placed in the immediate proximity of the irradiation zone and oriented on an optical axis; and the stream of radiation-generator material in the irradiation zone flows in a direction extending transversely relative to the optical axis.

In an advantageous embodiment, the second pressure is less than or equal to one-tenth of the first pressure.

Advantageously, the first pressure may be selected to be about $5 \times 10^{-3}$ millibars, and the second pressure to be about $5 \times 10^{-4}$ millibars.

The radiation-generator material may be gaseous xenon, or may advantageously be liquid xenon.

Alternatively, the radiation-generator material may be tin.

It is preferable for the power laser radiation to reach the irradiation zone via its face that faces towards the diaphragm. A first solution consists in causing the power laser beams to penetrate into the radiation chamber from the transmission chamber by passing through the diaphragm.

A second solution consists in directing the power laser beams into the irradiation zone immediately upstream from the diaphragm, by providing a diaphragm that is made in an intermediate wall that is conical in shape, with its apex directed towards the irradiation zone. The power laser beams then penetrate into the irradiation chamber upstream from the diaphragm, and propagate towards the irradiation zone along the conical intermediate wall.

The means for collecting and conditioning the EUV radiation may advantageously comprise, downstream from the diaphragm, one or more elliptical mirrors oriented on the optical axis, and having one focus situated in the irradiation zone.

Advantageously, it is also possible to provide an anti-debris device placed in the transmission chamber, facing and in the proximity of the diaphragm, in order to transmit the EUV radiation to the means for collecting and conditioning the emitted EUV radiation, while opposing the passage of ions and other particles coming from the irradiation chamber. For example, the anti-debris device may comprise a transverse stream of helium, argon, or krypton located downstream from the diaphragm and associated with means for collecting the transverse stream of helium, argon, or krypton, and the debris entrained thereby.

The invention also provides photo-litho-graphy apparatus comprising a radiation source as defined above for generating EUV radiation, a mask support device adapted to support a mask, a semi-conductor wafer support adapted to support a semi-conductor wafer for processing, and an optical system adapted to project onto the semi-conductor wafer an image of a portion of the mask irradiated by the EUV radiation.

Other objects, characteristics, and advantages of the present invention appear from the following description of particular embodiments, given with reference to the accompanying figures, in which.

Figure 1:
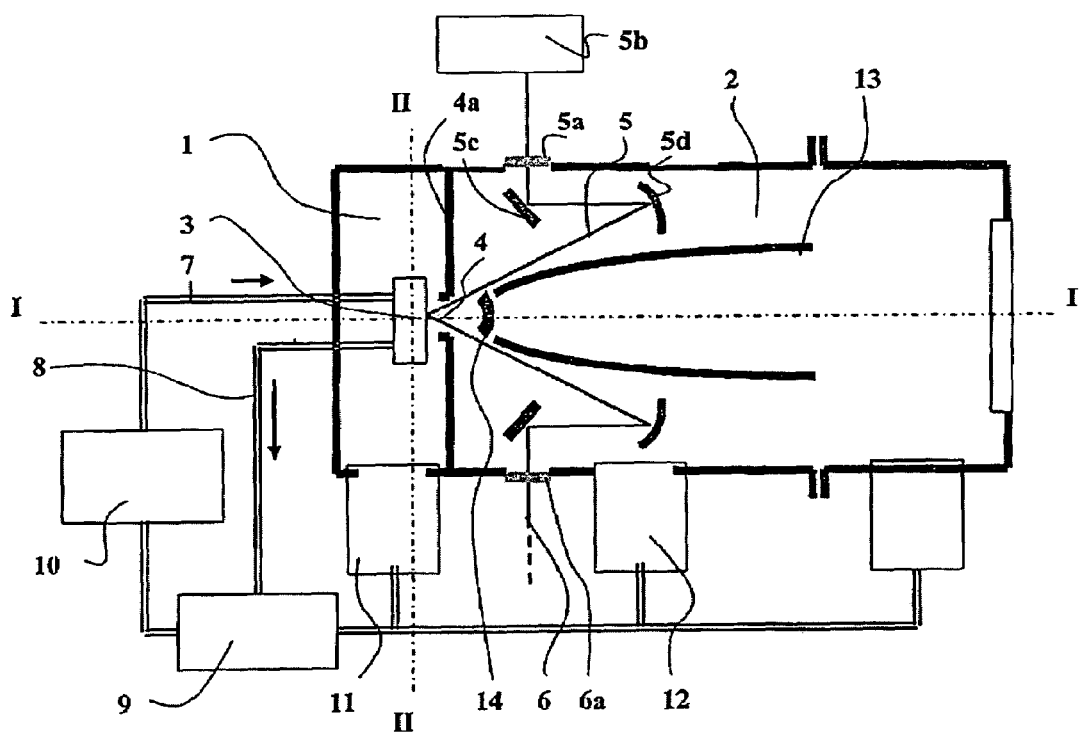
FIG. 1 is a diagram of the general structure of an EUV source in an embodiment of the present invention.

FIG. 1 is a diagram showing the general structure of an EUV source of the invention. There can be seen an irradiation chamber 1, a transmission chamber 2, an irradiation zone 3 situated in the irradiation chamber 1, and a diaphragm 4 provided in an intermediate wall 4a situated between the irradiation chamber 1 and the transmission chamber 2. The diaphragm 4 is oriented on an optical axis I—I which is the general axis along which the emitted EUV radiation is recovered.

Injection means 7 such as an inlet pipe serve to inject into the irradiation zone 3 a stream of radiation-generator material, which stream propagates in a direction II—II extending transversely relative to the optical axis I—I. The stream of radiation-generator material is recovered at the outlet from the irradiation zone 3 by a recycling pipe 8 which returns it via a primary pump 9 to a recycler 10 which then reinjects it into the irradiation zone 3 via the inlet pipe 7.

Power laser radiation is directed into the irradiation zone 3, which radiation is preferably constituted by a plurality of power laser beams 5, 6 converging on the irradiation zone 3, and striking the stream of radiation-generator material to produce EUV radiation.

The laser beams preferably strike the stream of radiation-generator material on the face of the stream that faces towards the diaphragm 4, and arrangements are made to ensure that the diaphragm 4 is in the immediate proximity of the irradiation zone 3. As a result, the emitted EUV radiation propagates preferentially through the diaphragm 4 towards the transmission chamber 2 around the optical axis I—I. In the transmission chamber 2, means such as a collector device 13 serve to collect and condition the EUV radiation emitted by the radiation-generator material in the irradiation zone 3.

The collector device 13 situated in the transmission chamber 2 may advantageously comprise one or more elliptical mirrors oriented on the optical axis I—I and having a first focus situated in the irradiation zone 3. As a result, the elliptical mirrors reflect the major fraction of the EUV radiation so as to direct it towards the second focus of the elliptical mirrors, which second focus is placed in the utilization zone.

An anti-debris device 14 may advantageously be provided in the transmission chamber 2 facing and in the proximity of the diaphragm 4 so as to transmit the EUV radiation to the collector device 13 while preventing ions and other particles passing from the diaphragm 4 towards the collector device 13.

An anti-debris debris 14 may, for example, comprise a transverse stream of helium, of argon, or of krypton, flowing downstream from the diaphragm 4.

In the irradiation zone 3, the radiation-generator material may be constituted by a stream of gaseous xenon, a stream of liquid microdroplets of xenon obtained by atomization, or a spaguetto of liquid xenon, for example.

Alternatively, it is possible to envisage using a target made of tin, which has a better conversion ratio than xenon, and which can thus generate EUV radiation of greater intensity. The target may be a disk of solid tin, or a stream of a tin alloy that is liquid at ambient temperature, such as an alloy of tin, indium, and lead.

The irradiation chamber 1 is a leaktight chamber, surrounded by a leakproof wall, communicating with the transmission chamber 2 solely via the diaphragm 4 which is of small size, e.g. being about 10 mm in diameter.

The transmission chamber 2 is also a leaktight chamber, surrounded by a leakproof wall and communicating with the irradiation chamber 1 solely via the diaphragm 4 of small size.

The irradiation chamber 1 is connected to first vacuum generator means 11 which maintain a first pressure P1. For example, as shown in FIG. 1, the first vacuum generator means 11 may comprise one or more first secondary turbo-molecular pumps 11 with their inlets connected to the irradiation chamber 1 and their outlets connected to the inlet of the primary pump 9.

Similarly, the transmission chamber 2 is connected to second vacuum generator means 12 which maintain a second pressure P2. For example, the second vacuum generator means 12 comprise one or more second secondary turbo-molecular pumps 12 with their inlets connected to the transmission chamber 2 and their outlets connected to the inlet of the primary pump 9.

The second pressure P2 present in the transmission chamber 2 is lower than the first pressure P1 present in the irradiation chamber 1 for the reasons given below.

In such an EUV radiation source operating by laser excitation of a stream of radiation-generator material, the radiation-generator material in the form of a gas or a liquid tends to diffuse rapidly into the irradiation chamber 1, thereby increasing the gas pressure that exists in the irradiation chamber 1. Unfortunately, high gas pressure quickly opposes propagation of EUV radiation. It is therefore necessary to maintain a vacuum on the propagation path of the EUV radiation that is sufficiently high to avoid absorbing the wanted radiation. However maintaining a low pressure, of the order of $5 \times 10^{-4}$ millibars, as is necessary to enable the EUV radiation to propagate over a sufficient length, would require vacuum pumps to be available capable of delivering a very high effective pumping speed, for example greater than 30,000 L/s. Unfortunately, such pumps are bulky, and cannot reasonably be used in an EUV radiation source for a semi-conductor photo-litho-graphic process.

Advantage is therefore taken of having two distinct chambers, namely an irradiation chamber 1 and a transmission chamber 2 in order to maintain a vacuum at two different pressures.

In the irradiation chamber 1, a vacuum is maintained at a first pressure P1 that is relatively high, and arrangements are made to ensure that the length of the path followed by the EUV radiation in the irradiation chamber 1 is very short. This is achieved by the fact that the diaphragm 4 is in the immediate proximity of the irradiation zone 3, and by the fact that the power laser radiation strikes the stream of radiation-generator material on its face that is facing the diaphragm 4.

In contrast, the transmission chamber 2 is maintained at a pressure P2 that is lower than the pressure P1 of the irradiation chamber 1. As a result, the absorption of the wanted EUV radiation on its path through the transmission chamber 2 is reduced.

The second pressure P2 in the transmission chamber 2 is preferably less than or equal to one-tenth the first pressure P1 in the irradiation chamber 1.

For example, good results can be obtained by providing a first pressure P1 that is less than or equal to about $5 \times 10^{-3}$ millibars, and a second pressure P2 less than or equal to $5 \times 10^{-4}$ millibars.

The vacuum at $5 \times 10^{-3}$ millibars can be achieved in the irradiation chamber 1 by one or two first turbo-molecular pumps 11 providing a total xenon pumping speed of about 3000 L/s. The size of the first turbo-molecular pump(s) 11 is thus compatible with the size that can be accepted in photo-litho-graphy installations for manufacturing semiconductor components.

It is found that the presence of a single diaphragm 4 of small size, e.g. having a diameter of about 10 mm, reduces the flow of radiation-generator material that propagates into the transmission chamber 2 very greatly, by a factor of about 10. As a result, the higher vacuum can be implemented and maintained in the transmission chamber 2 by one or two second turbo-molecular pumps 12 whose total xenon pumping speed is likewise equal to 3000 L/s. The size of the second turbo-molecular pumps 12 is thus kept down, and the assembly remains compatible with the space available in photo-litho-graphy installations for manufacturing semiconductors.

The single diaphragm 4 presents the advantage of being multidirectional, i.e. it allows radiation to pass that can be highly oblique relative to the optical axis I—I.

It is then possible to cause the power laser beams 5 and 6 that are incident in the irradiation chamber 1 to penetrate directly through the diaphragm 4 on oblique directions, as shown in FIG. 1. Under such circumstances, the incident laser beams 5 and 6 can penetrate into the transmission chamber 2 via windows 5a and 6a, coming from laser sources such as the source 5b, and they can be reflected by mirrors such as the mirrors 5c and 5d so as subsequently to propagate towards the diaphragm 4, which mirrors are located outside the collector device 13, with the laser beams coming to strike the surface of the stream of radiation-generator material which is located in the irradiation zone 3 in the immediate proximity of the diaphragm 4.

Alternatively, incident laser beams may be provided that penetrate directly into the irradiation chamber 1 upstream from the diaphragm 4, and that propagate towards the irradiation zone 3 along the intermediate wall 4a, upstream from the diaphragm 4. Under such circumstances, the diaphragm 4 is made in the intermediate wall 4a, which is advantageously conical in shape with the apex of the cone being directed towards the irradiation zone 3.

Figure 2:
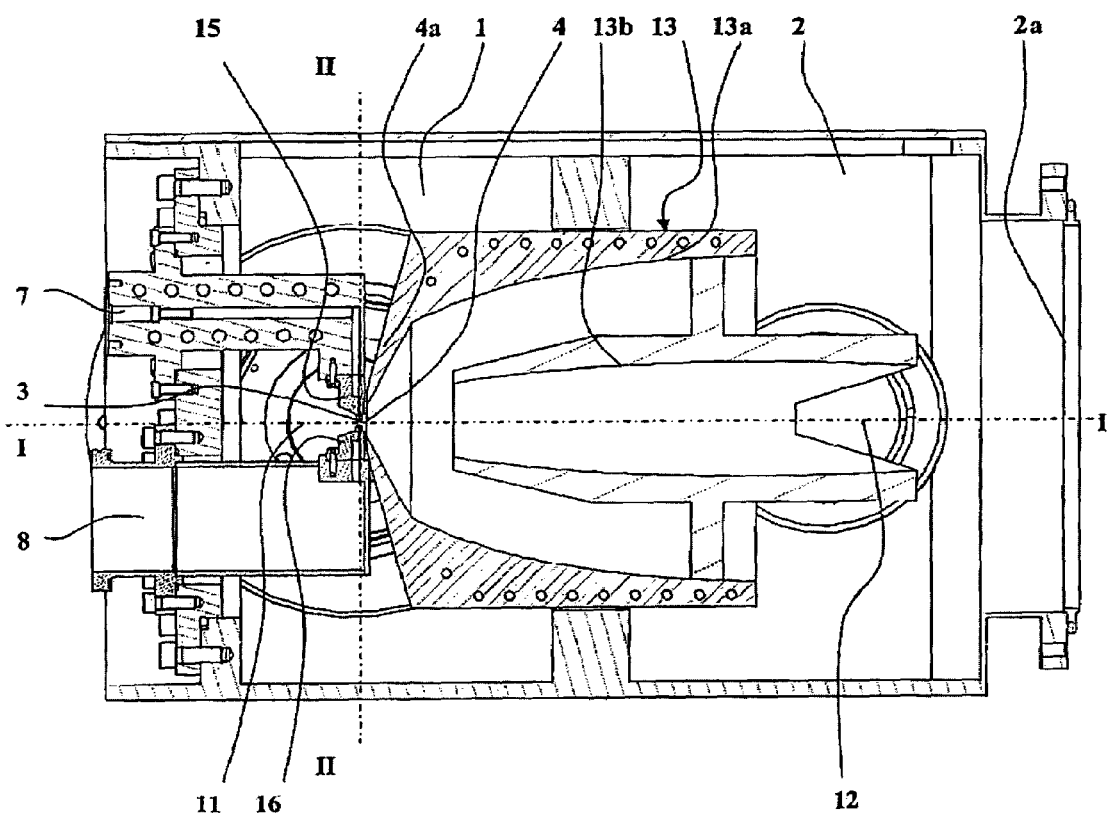
FIG. 2 is a longitudinal section showing a practical embodiment of the FIG. 1 EUV source.
Figure 3:
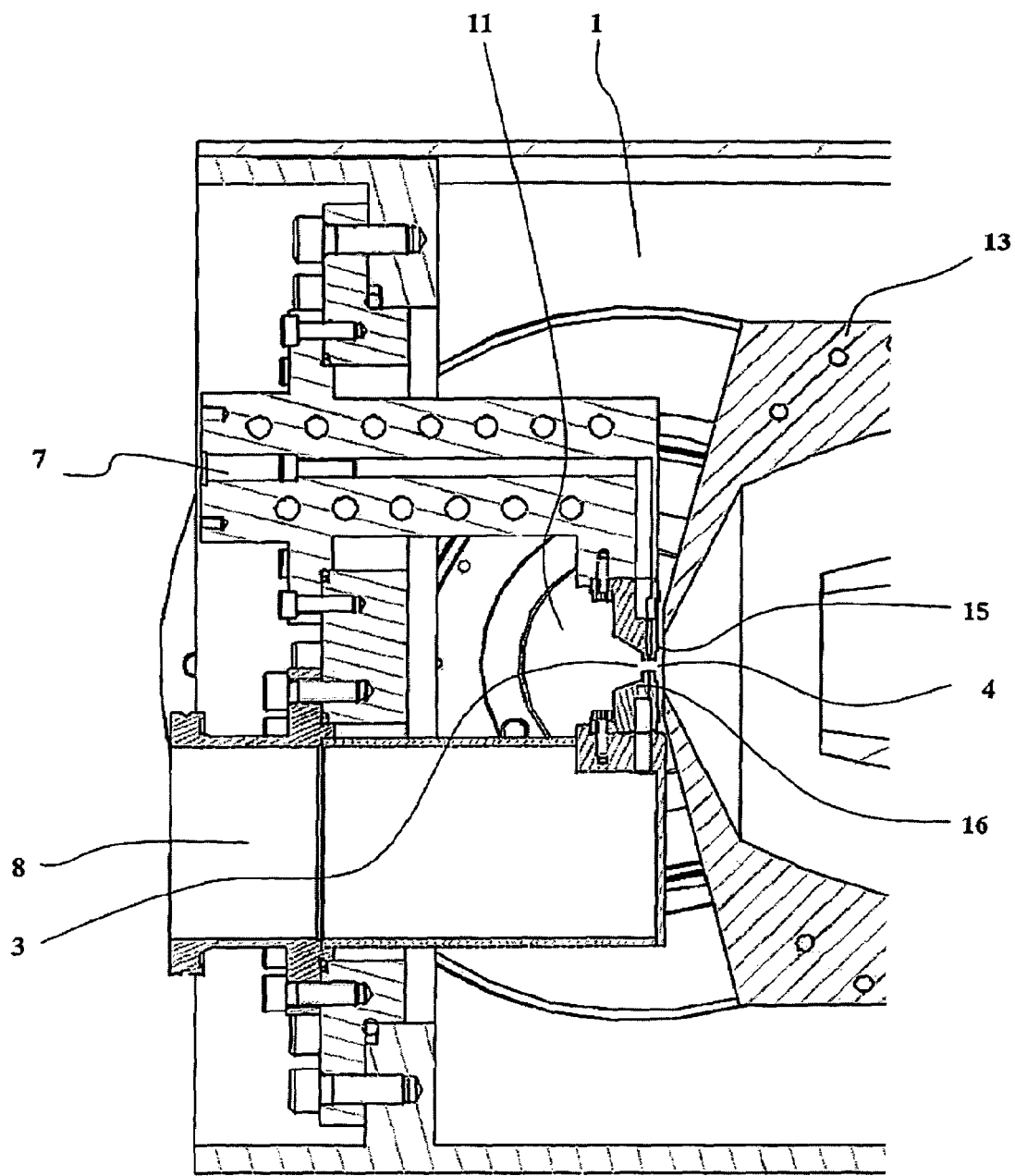
FIG. 3 is a view on a larger scale showing the irradiation zone of FIG. 2.

Reference is now made to FIGS. 2 and 3 which show a first practical embodiment of an EUV source of the present invention in longitudinal section.

FIGS. 2 and 3 show the same elements as those in the theoretical diagram of FIG. 1, and these elements are identified by the same numerical references.

Thus, there can be seen the irradiation chamber 1 and the transmission chamber 2 which are separated by the intermediate wall 4a provided with the diaphragm 4. A first secondary pump 11 is disposed laterally, and its suction orifice can be seen communicating directly with the irradiation chamber 1. Similarly, a second secondary pump 12 is disposed laterally and its suction orifice can be seen communicating directly with the transmission chamber 2.

In the irradiation chamber 1, the irradiation zone 3 is situated between an injector 15 connected to the inlet pipe 7 and a divertor 16 connected to the recycling pipe 8. The inlet pipe 7 and the recycling pipe 8 have bends so as to be connected respectively to the injector 15 and to the divertor 16, and they penetrate axially into the irradiation chamber 1. The irradiation zone is short in length, e.g. being about 3 mm long.

By way of example, the collector device 13 comprises two coaxial elliptical mirrors, i.e. an outer elliptical mirror 13a and an inner elliptical mirror 13b. The inner elliptical mirror 13b is set back from the diaphragm 4, as can be seen in the figures, while the outer elliptical mirror 13a is connected to a conical portion of the intermediate wall 4a between the irradiation chamber 1 and the transmission chamber 2. Alternatively, the outer elliptical wall 13a could advantageously be connected to a hyperbolic mirror surrounding the diaphragm 4 so as to optimize the quantity of EUV radiation that is collected.

The collector device 13 recovers the EUV radiation emitted over a solid angle centered on the optical axis I—I and substantially defining a cone of approximately 120°.

The transmission chamber 2 is closed downstream by a wall 2a that is transparent to the emitted EUV radiation, and that optionally acts as a filter to eliminate radiation at a wave-length that is longer than the desired radiation. The wall 2a isolate the atmosphere inside the transmission chamber 2 from the atmosphere downstream from the wall 2a.

The mirrors of the collector device 13 are elliptical in shape, a first focus being situated in the radiation zone 3, the second focus being situated at the entry 25 (FIG. 5) of the optical system of a mask repeater with an optical reducing system 26, reduces the radiation to process a semi-conductor wafer. The EUV radiation is thus focused on the entry 25 of the optical system 25, 26.

Figure 4:
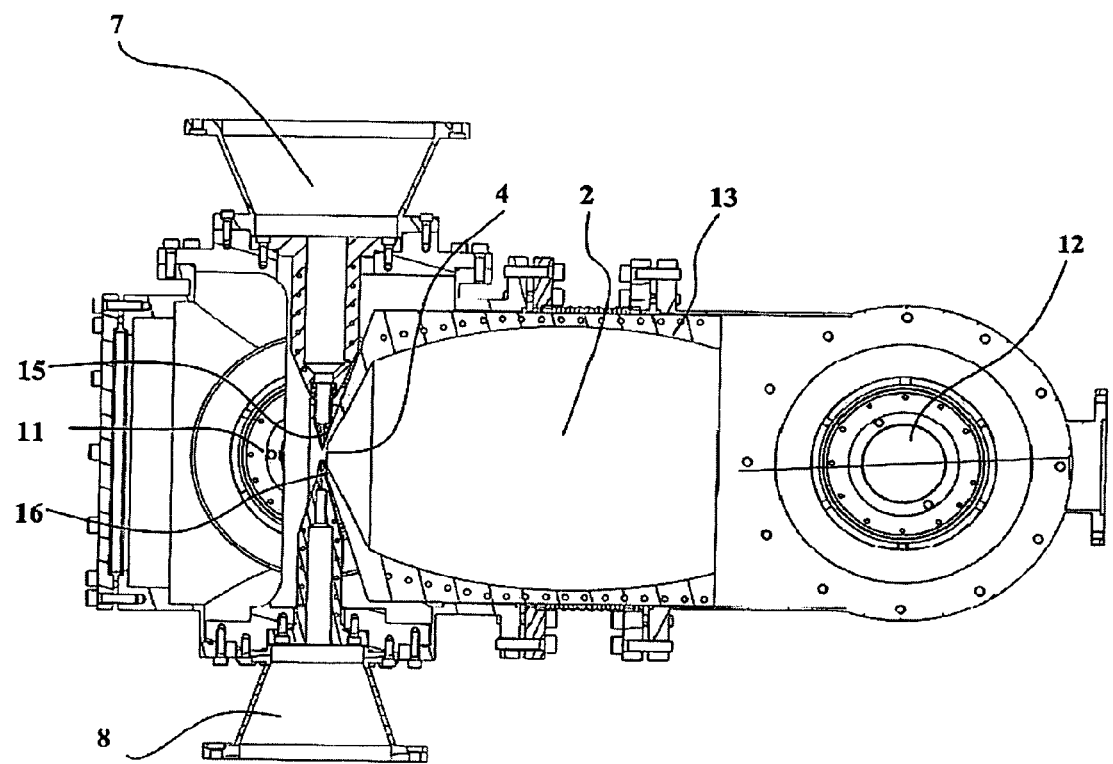
FIG. 4 shows a variant practical embodiment of the EUV source of the invention.

FIG. 4 shows a variant of the FIG. 2 EUV radiation source, in which variant the pipes 7 and 8 penetrate radially into the irradiation chamber 1, in line respectively with the injector 15 and the divertor 16.

Figure 5:
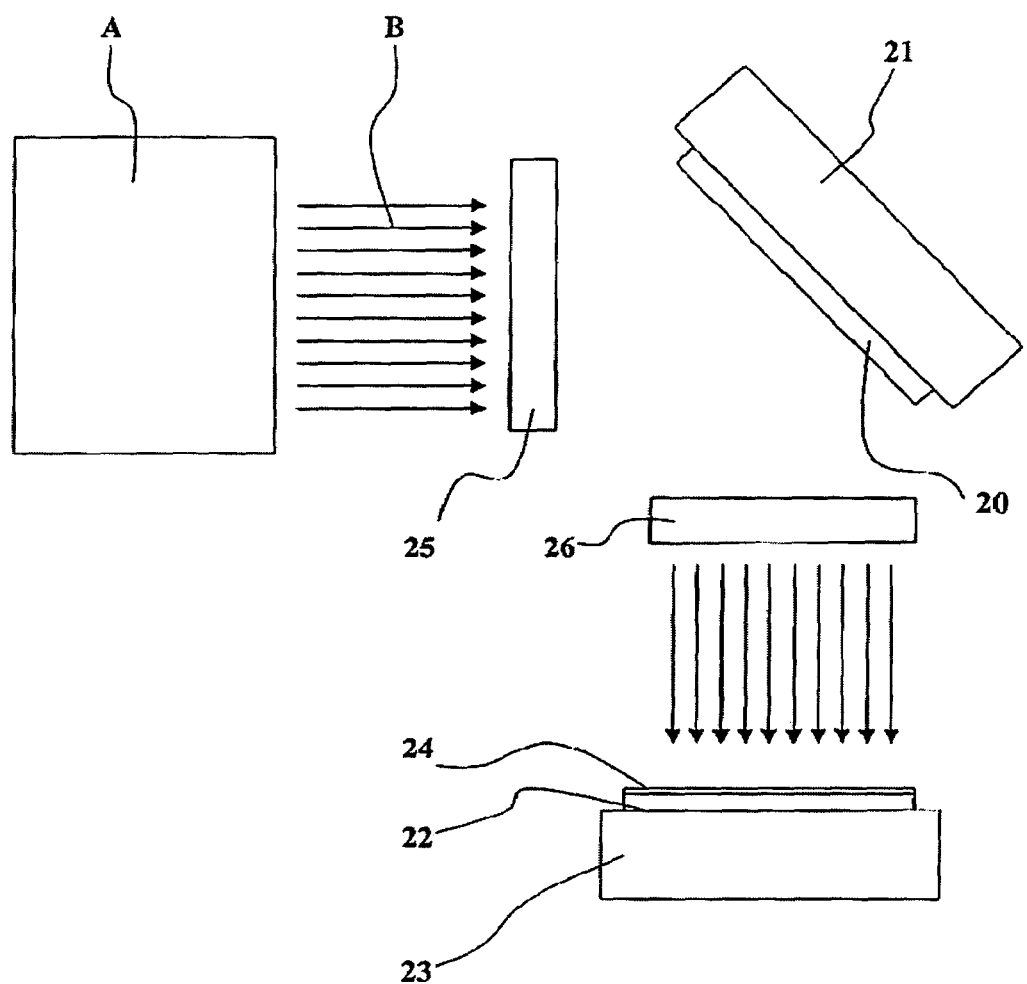
FIG. 5 illustrates the application of the EUV source of the invention to a photo-litho-graphic device.

FIG. 5 shows the use of an EUV source of the invention for processing a semi-conductor wafer.

The radiation source is represented by a rectangle and is identified by reference A. The EUV radiation B is directed through the entry 25 of the mask repeater to a mask 20 supported by a mask support device 21. The mask 20 is reflective and reflects the radiation through the optical reducing system 26 of the mask reducer onto a semi-conductor wafer 22, itself supported by a wafer support 23. By way of example, the semi-conductor wafer 22 has a surface covered in a layer 24 that is to be processed by the EUV radiation so as to take on the pattern of the mask 20, with a reduction ratio determined by the optics of the reducing system 26.

The present invention is not limited to the embodiments described explicitly, but includes the variety of variants and generalizations that are within the competence of the person skilled in the art.

The invention claimed is:

1. A source of radiation in the extreme ultra-violet (EUV), the source comprising means (7, 15) for injecting a stream of radiation-generator material into the inlet of an irradiation zone (3), means (8, 16) for picking up the stream of radiation-generator material leaving the irradiation zone (3), means for generating and focusing power laser radiation (5, 6) on the radiation-generator material in the irradiation zone (3), means (13) for collecting and conditioning the EUV radiation emitted by the radiation-generator material in the irradiation zone (3), and first vacuum generator means (11) connected to an irradiation chamber (1) in which the irradiation zone (3) is situated for maintaining a first pressure (P1), the source being characterized in that:

the means (13) for collecting and conditioning the emitted EUV radiation are placed in a transmission chamber (2) which is connected to second vacuum generator means (12) for maintaining a second pressure (P2) lower than the first pressure (P1);

the transmission chamber (2) communicates with the irradiation chamber (1) via a diaphragm (4) of small size placed in the immediate proximity of the irradiation zone (3) and oriented on an optical axis (I—I); and the stream of radiation-generator material in the irradiation zone (3) flows in a direction (II—II) extending transversely relative to the optical axis (I—I).

2. A radiation source according to claim 1, characterized in that the second pressure (P2) is less than or equal to one-tenth of the first pressure (P1).

3. A radiation source according to claim 2, characterized in that the first pressure (P1) is less than or equal to $5\times10^{-4}$ millibars, while the second pressure (P2) is less than or equal to $5\times10^{-4}$ millibars.

4. A radiation source according to claim 1, characterized in that the radiation-generator material is gaseous xenon.

5. A radiation source according to claim 1, characterized in that the radiation-generator material is liquid xenon.

6. A radiation source according to claim 1, characterized in that the radiation-generator material is tin.

7. A radiation source according to claim 1, characterized in that the power laser radiation strikes the flow of radiation-generator material on the face of the flow that faces towards the diaphragm (4).

8. A radiation source according to claim 1, characterized in that the power laser radiation is constituted by a plurality of laser beams converging on the irradiation zone (3).

9. A radiation source according to claim 8, characterized in that the incident power laser beams (5, 6) penetrate into the irradiation chamber (1) by passing through the diaphragm (4).

10. A radiation source according to claim 8, characterized in that the power laser beams (5, 6) penetrate into the irradiation chamber upstream from the diaphragm (4), and propagate towards the irradiation zone (3) along the intermediate wall (4a), the diaphragm (4) itself being made in an intermediate wall (4a) of conical shape with its apex directed towards the irradiation zone (3).

11. A radiation source according to claim 1, characterized in that the transmission chamber (2) includes one or more elliptical mirrors (13a, 13b) oriented on the optical axis (I—I) and having one focus situated in the irradiation zone (3).

12. A radiation source according to claim 1, characterized in that it further includes an anti-debris device (14) provided in the transmission chamber (2) facing and in the proximity of the diaphragm (4) in order to transmit the EUV radiation to the means (13) for collecting and conditioning the emitted EUV radiation while opposing passage of ions and other particles coming from the irradiation chamber (1).

13. A radiation source according to claim 12, characterized in that the anti-debris device (14) comprises a transverse stream of helium, of argon, or of krypton, located downstream from the diaphragm (4).

14. Photo-litho-graphy apparatus comprising a source (A) of EUV radiation (B), a mask support device (21) adapted to support a mask (20), a semi-conductor wafer support (23) adapted to support a semi-conductor wafer (22) for processing, and an optical system (25, 26) adapted to project onto the semi-conductor wafer (22) an image of a portion of the mask (20) irradiated by the EUV radiation (B), the apparatus being characterized in that the radiation source (A) is a source according to claim 1.

15. Photo-litho-graphy apparatus according to claim 14, characterized in that the radiation source (A) includes elliptical mirrors having one focus at the entry (25) of the optical system (25, 26) for focusing the EUV radiation (B) on the entry (25) of the optical system (25, 26).

16. A source of radiation in the extreme ultra-violet (EUV), the source comprising:
- an irradiation chamber, comprising:
  - an irradiation zone having an inlet and an outlet;
  - a first conduit from which a stream of radiation-generator material is injected into the inlet of the irradiation zone; and
  - a second conduit that picks up the stream of radiation-generator material leaving the irradiation zone from the outlet;
- a first vacuum generator connected to the irradiation chamber and that maintains a first pressure (P1);
- a laser radiation generator that emits laser radiation on the radiation-generator material in the irradiation zone, which results in the emission of EUV radiation;
- a transmission chamber, comprising a collector that recovers EUV radiation emitted from the irradiation zone; and
- a second vacuum generator connected to the transmission chamber and that maintains a second pressure (P2) lower than the first pressure (P1); and
- wherein the transmission chamber communicates with the irradiation chamber via a diaphragm of small size placed in the immediate proximity of the irradiation zone and oriented on an optical axis (I—I); and
- the stream of radiation-generator material in the irradiation zone flows in a direction (II—II) extending transversely relative to the optical axis (I—I).

17. The radiation source according to claim 16, wherein the second pressure (P2) is less than or equal to one-tenth of the first pressure (P1).

18. The radiation source according to claim 16, wherein the laser radiation passes through the diaphragm from the transmission chamber.

19. The radiation source according to claim 16, wherein the diaphragm is about 10 mm wide.

20. The radiation source according to claim 16, wherein the collector comprises elliptical mirrors.

* * * * *